United States Patent
Kim et al.

(12) 
(10) Patent No.: US 11,281,255 B2
(45) Date of Patent: Mar. 22, 2022

(54) ELECTRONIC DEVICE HAVING WATERPROOF STRUCTURE FOR ELECTRONIC COMPONENT

(71) Applicant: Samsung Electronics Co., Ltd., Gyeonggi-do (KR)

(72) Inventors: Sangmin Kim, Gyeonggi-do (KR); Daeyoung Noh, Gyeonggi-do (KR); Minchang Shim, Gyeonggi-do (KR); Soonwoong Yang, Gyeonggi-do (KR); Seunghoon Lee, Gyeonggi-do (KR); Daehyeong Park, Gyeonggi-do (KR); Byounguk Yoon, Gyeonggi-do (KR)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 16/843,372

(22) Filed: Apr. 8, 2020

(65) Prior Publication Data
US 2020/0348725 A1 Nov. 5, 2020

(30) Foreign Application Priority Data

Apr. 30, 2019 (KR) .................. 10-2019-0050370

(51) Int. Cl.
| | | |
|---|---|---|
| *G06F 1/16* | (2006.01) | |
| *H05K 5/00* | (2006.01) | |
| *H05K 5/03* | (2006.01) | |
| *H05K 5/06* | (2006.01) | |
| *H05K 5/02* | (2006.01) | |
| *H04M 1/02* | (2006.01) | |

(52) U.S. Cl.
CPC .......... *G06F 1/1637* (2013.01); *G06F 1/1656* (2013.01); *H04M 1/0266* (2013.01); *H05K 5/0017* (2013.01); *H05K 5/0217* (2013.01); *H05K 5/03* (2013.01); *H05K 5/069* (2013.01)

(58) Field of Classification Search
CPC .... G06F 1/1637; G06F 1/1656; G06F 1/1686; H05K 5/0017; H05K 5/03; H05K 5/069; H05K 5/0217; H04M 1/0266; H04M 1/026; H04M 2250/12; H04M 1/18
See application file for complete search history.

(56) References Cited

U.S. PATENT DOCUMENTS

| | | | |
|---|---|---|---|
| 8,866,989 | B2 | 10/2014 | Mathew et al. |
| 9,872,408 | B2 | 1/2018 | Choi et al. |
| 10,134,540 | B2 * | 11/2018 | Choi ............... G06F 1/1637 |

(Continued)

FOREIGN PATENT DOCUMENTS

| | | |
|---|---|---|
| KR | 1020170040082 | 4/2017 |
| KR | 1020180013436 | 2/2018 |

(Continued)

OTHER PUBLICATIONS

International Search Report dated Jun. 19, 2020 issued in counterpart application No. PCT/KR2020/003592, 3 pages.

*Primary Examiner* — Abhishek M Rathod
(74) *Attorney, Agent, or Firm* — The Farrell Law Firm, P.C.

(57) ABSTRACT

Disclosed is an electronic device that realizes improved, reliable waterproof performance by sealing the perimeter of an electronic component disposed simultaneously over both a black mask (BM) region and a display region of the electronic device, thereby securing the continuity of a waterproof loop around the electronic device.

15 Claims, 15 Drawing Sheets

(56) References Cited

U.S. PATENT DOCUMENTS

| | | | |
|---|---|---|---|
| 10,405,446 B2 | 9/2019 | Choi et al. | |
| 10,512,184 B2 | 12/2019 | Cho et al. | |
| 10,674,572 B2 | 6/2020 | Cho et al. | |
| 2015/0245522 A1* | 8/2015 | Kang | G06F 1/1656 361/728 |
| 2015/0282364 A1* | 10/2015 | Moon | H04M 1/18 174/50.51 |
| 2017/0099742 A1 | 4/2017 | Choi et al. | |
| 2018/0310426 A1* | 10/2018 | Cho | H05K 5/069 |
| 2018/0364869 A1 | 12/2018 | Lee et al. | |
| 2019/0228204 A1 | 7/2019 | Park et al. | |
| 2019/0246507 A1* | 8/2019 | Hisano | H04B 1/3888 |
| 2019/0254129 A1* | 8/2019 | Cho | G06F 1/1656 |

FOREIGN PATENT DOCUMENTS

| | | |
|---|---|---|
| KR | 1020180026191 | 3/2018 |
| KR | 101855464 | 6/2018 |
| KR | 1020180118332 | 10/2018 |
| KR | 1020180136386 | 12/2018 |

\* cited by examiner

ELECTRONIC DEVICE HAVING WATERPROOF STRUCTURE FOR ELECTRONIC COMPONENT

CROSS-REFERENCE TO RELATED APPLICATION(S)

This application is based on and claims priority under 35 U.S.C. § 119 to Korean Patent Application No. 10-2019-0050370, filed on Apr. 30, 2019, in the Korean Intellectual Property Office, the disclosure of which is incorporated by reference herein in its entirety.

BACKGROUND

1. Field

The disclosure relates generally to an electronic device, and more particularly, to an electronic device having a waterproof structure for an electronic component.

2. Description of Related Art

An electronic device contains a large variety of densely disposed electronic components. In order to protect these electronic components, the electronic device not only has a firmly designed exterior, but also has a waterproof and dustproof structure for preventing the inflow of water and foreign matter.

In the electronic device, a window and a housing are combined with each other by an adhesive member that is capable of blocking water and foreign matter from flowing into the electronic device through a gap between the window and the housing. In addition, a display disposed on a rear surface of the window may also be combined with the housing through an adhesive member that may block the inflow of water and foreign matter through a gap between the display and the housing.

In a front view, the electronic device has a black mask (BM) region corresponding to a difference in size between the display and the housing. As the area occupied by the display in the window of the electronic device is gradually increased, that is, as the BM region is gradually decreased, a certain electronic component tends to be partially disposed in not only the BM region but also a display region. In this case, the continuity of the adhesive member for combining the BM region and/or the display with the housing is compromised, thereby rendering it difficult for the adhesive member to block the inflow of water.

As such, there is a need in the art for a method and apparatus that prevents any such limit to the effectiveness of the adhesive member in blocking water and foreign matter from entering the electronic device.

SUMMARY

Aspects of the disclosure are to address at least the above-mentioned problems and/or disadvantages and to provide at least the advantages described below. Accordingly, an aspect of the disclosure is to provide an electronic device that realizes improved, reliable waterproof performance by sealing the perimeter of an electronic component disposed simultaneously over both a BM region and a display region and thereby securing the continuity of a waterproof loop.

In accordance with an aspect of the disclosure, an electronic device may include a housing including a front plate, a rear plate spaced apart from and disposed to be parallel with the front plate, and a lateral member surrounding a space between the front plate and the second plate, a display disposed in the space of the housing, being viewable through at least a part of the front plate, and formed to have less area than the front plate, an electronic component disposed in the housing and including, when the front plate is viewed from above, a first portion overlapping the front plate, and a second portion overlapping both the display and the front plate, a first adhesive member disposed between the front plate and the lateral member and surrounding a part of the first portion, a second adhesive member disposed between the display and the lateral member, spaced apart from the first adhesive member, and extended in a first direction along one periphery of the display around the electronic component, a third adhesive member disposed between the display and the lateral member, spaced apart from the first adhesive member, and extended in a second direction along the one periphery of the display around the electronic component, and at least one waterproof seal member filling, at least in part, a space between the first and second adhesive members and a space between the first and third adhesive members.

In accordance with another aspect of the disclosure, an electronic device may include a housing including a front plate, a rear plate spaced apart from and disposed to be parallel with the front plate, and a lateral member surrounding a space between the front plate and the second plate, a display disposed in the space of the housing, being viewable through at least a part of the front plate, and formed of less area than the front plate, an electronic component disposed in the housing and including, when the front plate is viewed from above the display, a first portion partially overlapping the front plate, and a second portion partially overlapping both the display and the front plate, a first adhesive member disposed between the front plate and the lateral member and surrounding a part of the first portion, a second adhesive member disposed between the display and the lateral member, spaced apart from the first adhesive member, and extended in a first direction along one periphery of the display around the electronic component, a third adhesive member disposed between the display and the lateral member, spaced apart from the first adhesive member, and extended in a second direction along the one periphery of the display around the electronic component, and at least one waterproof seal member filling, at least in part, a space between the front plate and the electronic component.

In accordance with another aspect of the disclosure, an electronic device may include a housing including a front plate facing a first direction, a rear plate facing a second direction opposite to the first direction, and a lateral member surrounding a space between the front plate and the second plate, the front plate having a first periphery having a first length, a second periphery having a second length greater than the first length and substantially perpendicular to the first periphery, a third periphery having the first length and parallel to the first periphery, and a fourth periphery having the second length and parallel to the second periphery, a display disposed in the space of the housing and being viewable through at least a part of the front plate, the display having a fifth periphery having a third length and parallel to the first periphery, a sixth periphery having a fourth length greater than the third length and parallel to the second periphery, a seventh periphery having the third length and parallel to the fifth periphery, and an eighth periphery having the fourth length and parallel to the sixth periphery, an electronic component disposed in the housing and including, when the front plate is viewed from above the display, a first portion disposed in a first area between the first periphery of the front plate and the fifth periphery of the display, and a second portion disposed in a second area adjoining the first area and overlapping a part of the display, a first adhesive member disposed between the front plate and the lateral member and surrounding a part of the first portion when the front plate is viewed from above the display, a second adhesive member disposed between the display and the lateral member, spaced apart from the first adhesive member, and extended along one part of the fifth periphery when the front plate is viewed from above the display, a third adhesive member disposed between the display and the lateral member, spaced apart from the first adhesive member, extended along another part of the fifth periphery when the front plate is viewed from above the display, and positioned such that the electronic component is disposed between the second and third adhesive members; and at least one waterproof seal member filling, at least in part, a space between the first and second adhesive members and a space between the first and third adhesive members.

BRIEF DESCRIPTION OF THE DRAWINGS

The above and other aspects, features and advantages of certain embodiments of the disclosure will be more apparent from the following detailed description, taken in conjunction with the accompanying drawings.

DETAILED DESCRIPTION

Figure 1:
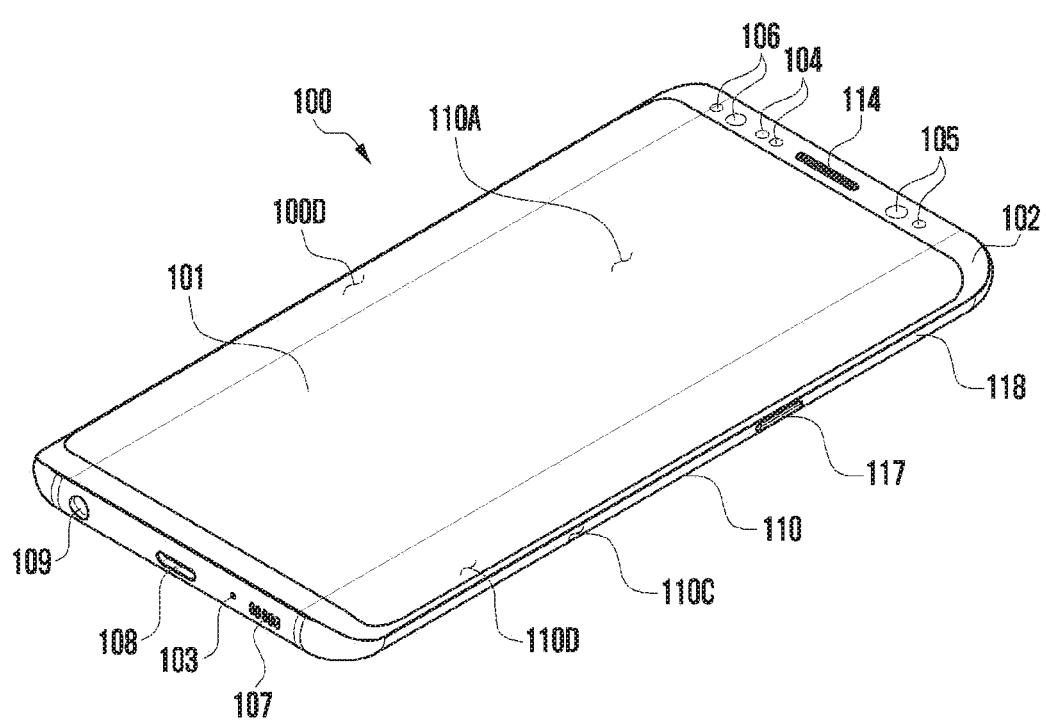
FIG. 1 is a perspective view illustrating a front surface of an electronic device according to an embodiment.

Hereinafter, embodiments of the disclosure will be described in detail with reference to accompanying drawings. In the disclosure, embodiments are described in the drawings and a related detailed description is set forth, but this is not intended to limit the embodiments of the disclosure. Descriptions of well-known functions and constructions are omitted for the sake of clarity and conciseness.

Figure 2:
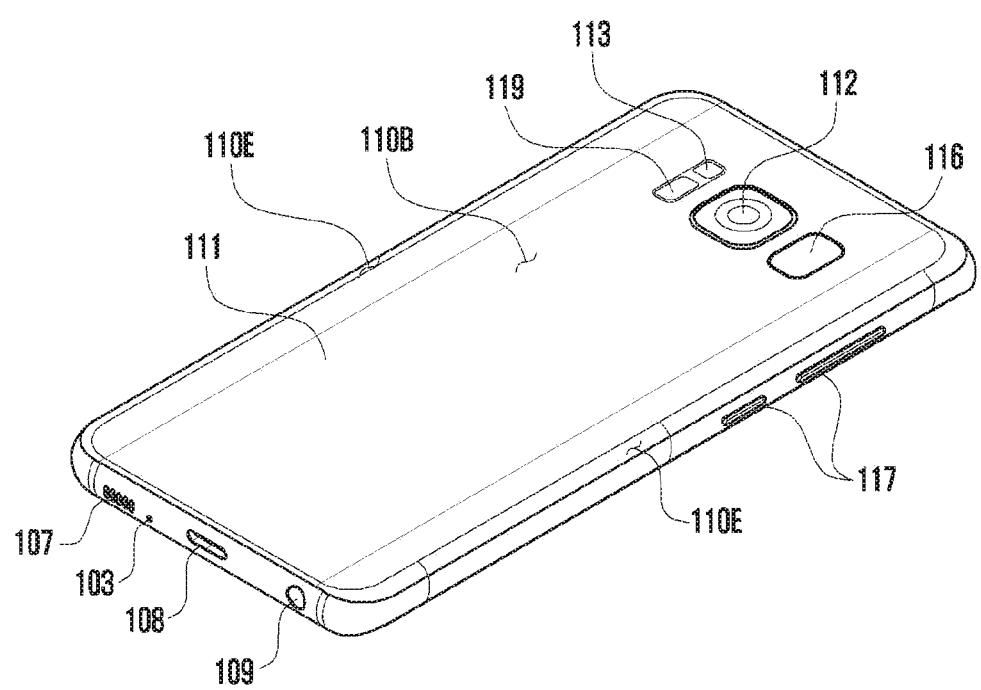
FIG. 2 is a perspective view illustrating a rear surface of the electronic device shown in FIG. 1.

FIG. 1 illustrates a perspective view of a front surface of an electronic device according to an embodiment. FIG. 2 illustrates a perspective view of a rear surface of the electronic device shown in FIG. 1.

Referring to FIGS. 1 and 2, an electronic device 100 may include a housing 110 that includes a first surface (or front surface) 110A, a second surface (or rear surface) 110B, and a lateral surface 110C that surrounds a space between the first surface 110A and the second surface 110B. The housing 110 is a structure that forms a part of the first surface 110A, the second surface 110B, and the lateral surface 110C. The first surface 110A may be formed of a front plate 102 (e.g., a glass plate or polymer plate coated with a variety of coating layers) at least a part of which is substantially transparent. The second surface 110B may be formed of a rear plate 111 which is substantially opaque. The rear plate 111 may be formed of coated or colored glass, ceramic, polymer, metal (e.g., aluminum, stainless steel (STS), or magnesium), or any combination thereof. The lateral surface 110C may be formed of a lateral bezel structure (or "lateral member") 118 which is combined with the front plate 102 and the rear plate 111 and includes a metal and/or polymer. The rear plate 111 and the lateral bezel structure 118 may be integrally formed and may be of the same material (e.g., a metallic material such as aluminum).

The front plate 102 may include two first regions 110D disposed at long edges thereof, respectively, and bent and extended seamlessly from the first surface 110A toward the rear plate 111. The rear plate 111 may include two second regions 110E disposed at long edges thereof, respectively, and bent and extended seamlessly from the second surface 110B toward the front plate 102. The front plate 102 (or the rear plate 111) may include only one of the first regions 110D or of the second regions 110E. The first regions 110D or the second regions 110E may be omitted in part. When viewed from a lateral side of the electronic device 100, and as illustrated in FIG. 1, the lateral bezel structure 118 may have a first thickness (or width) on a lateral side where the first region 110D or the second region 110E is not included, and may have a second thickness, being less than the first thickness, on another lateral side where the first region 110D or the second region 110E is included.

The electronic device 100 may include at least one of a display 101, audio modules 103, 107 and 114, sensor modules 104, 116 and 119, camera modules 105, 112 and 113, key input devices 117, a light emitting device 106, and connector holes 108 and 109. The electronic device 100 may omit at least one of the above components or may further include other components.

The display 101 may be exposed through a substantial portion of the front plate 102, for example. At least a part of the display 101 may be exposed through the front plate 102 that forms the first surface 110A and the first region 110D of the lateral surface 110C. Outlines (i.e., edges and corners) of the display 101 may have substantially the same form as those of the front plate 102. The spacing between the outline of the display 101 and the outline of the front plate 102 may be substantially unchanged in order to enlarge the exposed area of the display 101.

A recess or opening may be formed in a portion of a display area of the display 101 to accommodate at least one of the audio module 114, the sensor module 104, the camera module 105, and the light emitting device 106. At least one of the audio module 114, the sensor module 104, the camera module 105, the fingerprint sensor 116, and the light emitting element 106 may be disposed on the back of the display area of the display 101. The display 101 may be combined with, or adjacent to, a touch sensing circuit, a pressure sensor capable of measuring the touch strength (pressure), and/or a digitizer for detecting a stylus pen. At least a part of the sensor modules 104 and 119 and/or at least a part of the key input devices 117 may be disposed in the first region 110D and/or the second region 110E.

The audio modules 103, 107 and 114 may correspond to a microphone hole 103 and speaker holes 107 and 114, respectively. The microphone hole 103 may contain a microphone disposed therein for acquiring external sounds, and a plurality of microphones to sense a sound direction. The speaker holes 107 and 114 may be classified into an external speaker hole 107 and a call receiver hole 114. The microphone hole 103 and the speaker holes 107 and 114 may be implemented as a single hole, or a speaker (e.g., a piezo speaker) may be provided without the speaker holes 107 and 114.

The sensor modules 104, 116 and 119 may generate electrical signals or data corresponding to an internal operating state of the electronic device 100 or to an external environmental condition. The sensor modules 104, 116 and 119 may include a first sensor module 104 (e.g., a proximity sensor) and/or a second sensor module (e.g., a fingerprint sensor) disposed on the first surface 110A of the housing 110, and/or a third sensor module 119 (e.g., a heart rate monitor (HRM) sensor) and/or a fourth sensor module 116 (e.g., a fingerprint sensor) disposed on the second surface 110B of the housing 110. The fingerprint sensor may be disposed on the second surface 110B as well as the first surface 110A (e.g., the display 101) of the housing 110. The electronic device 100 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, and an illuminance sensor.

The camera modules 105, 112 and 113 may include a first camera device 105 disposed on the first surface 110A of the electronic device 100, and a second camera device 112 and/or a flash 113 disposed on the second surface 110B. The camera module 105 or the camera module 112 may include one or more lenses, an image sensor, and/or an image signal processor (ISP). The flash 113 may include a light emitting diode or a xenon lamp. Two or more lenses (infrared cameras, wide angle and telephoto lenses) and image sensors may be disposed on one side of the electronic device 100.

The key input devices 117 may be disposed on the lateral surface 110C of the housing 110. The electronic device 100 may not include some or all of the key input devices 117 described above, and the key input devices 117 which are not included may be implemented in another form such as a soft key on the display 101. The key input devices 117 may include the sensor module 116 disposed on the second surface 110B of the housing 110.

The light emitting device 106 may be disposed on the first surface 110A of the housing 110, and may provide status information of the electronic device 100 in an optical form. The light emitting device 106 may provide a light source associated with the operation of the camera module 105. The light emitting device 106 may include a light emitting diode (LED), an IR LED, or a xenon lamp.

The connector holes 108 and 109 may include a first connector hole 108 adapted for a connector (e.g., a universal serial bus (USB) connector) for transmitting and receiving power and/or data to and from an external electronic device, and/or a second connector hole 109 adapted for a connector (e.g., an earphone jack) for transmitting and receiving an audio signal to and from an external electronic device.

Figure 3:
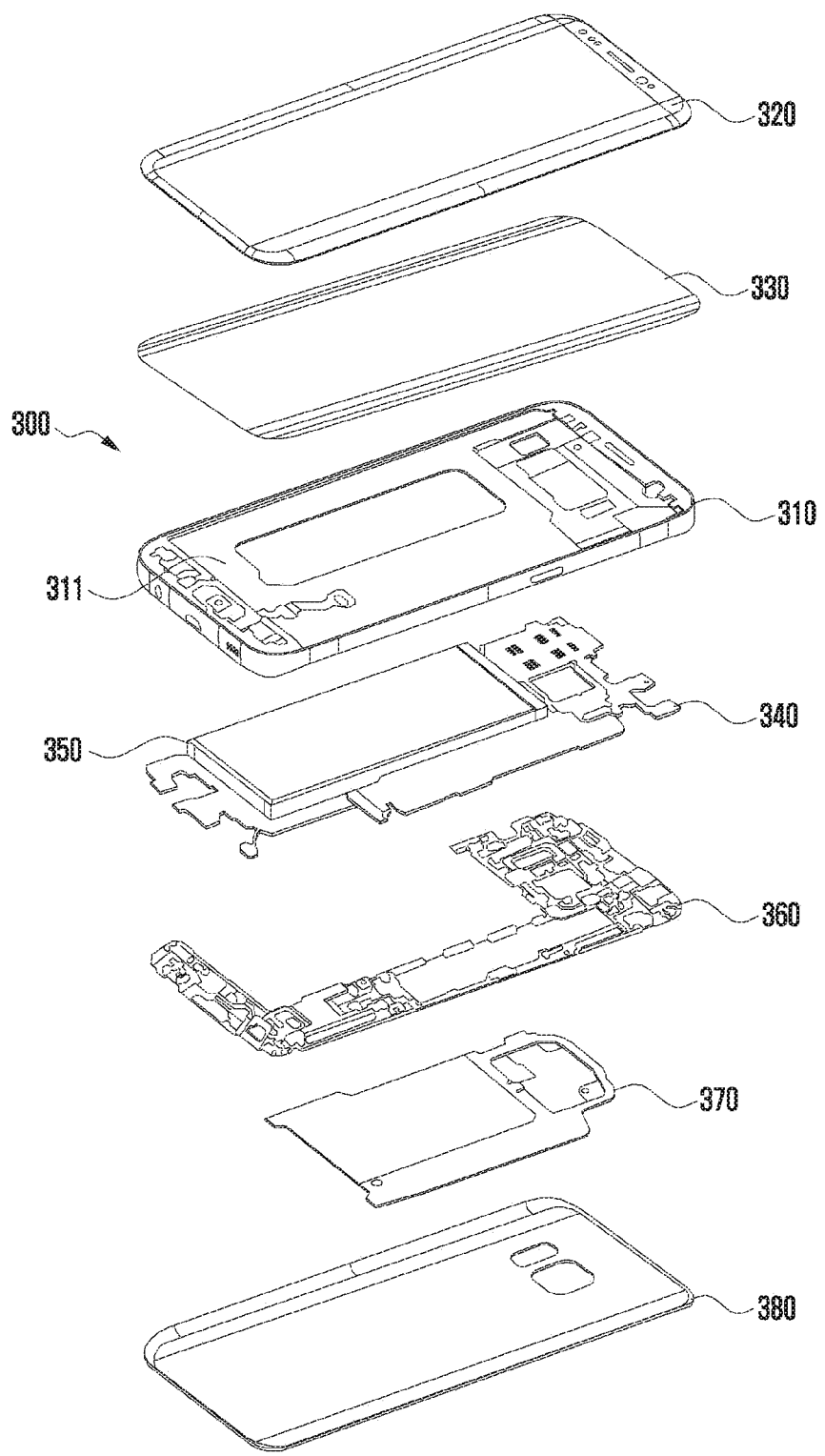
FIG. 3 is an exploded perspective view illustrating the electronic device shown in FIGS. 1 and 2.

FIG. 3 illustrates an exploded perspective view of the electronic device shown in FIGS. 1 and 2.

Referring to FIG. 3, the electronic device 300 may include a lateral bezel structure 310, a first support member 311 (e.g., a bracket), a front plate 320, a display 330, a printed circuit board (PCB) 340, a battery 350, a second support member 360 (e.g., a rear case), an antenna 370, and a rear plate 380. The electronic device 300 may omit at least one of the above components or may further include another component. Some components of the electronic device 300 may be the same as or similar to those of the electronic device 100 shown in FIG. 1 or FIG. 2, thus, descriptions thereof are omitted below.

The first support member 311 is disposed inside the electronic device 300 and may be connected to, or integrated with, the lateral bezel structure 310. The first support member 311 may be formed of a metallic material and/or a non-metal (e.g., polymer) material. The first support member 311 may be combined with the display 330 at one side thereof and also combined with the PCB 340 at the other side thereof. A processor, a memory, and/or an interface may be mounted on the PCB 340. The processor may include one or more of a central processing unit (CPU), an application processor (AP), a graphics processing unit (GPU), an ISP, a sensor hub processor, or a communication processor (CP).

The memory may include a volatile memory or non-volatile memory.

The interface may include a high definition multimedia interface (HDMI), a USB interface, a secure digital (SD) card interface, and/or an audio interface. The interface may electrically or physically connect the electronic device 300 with an external electronic device and may include a USB connector, an SD card/multimedia card (MMC) connector, or an audio connector.

The battery 350 is a device for supplying power to at least one component of the electronic device 300 and may include a non-rechargeable primary battery, a rechargeable secondary battery, or a fuel cell. At least a part of the battery 350 may be disposed on substantially the same plane as the PCB 340. The battery 350 may be integrally disposed within and detachably disposed from the electronic device 300.

The antenna 370 may be disposed between the rear plate 380 and the battery 350. The antenna 370 may include a near field communication (NFC) antenna, a wireless charging antenna, and/or a magnetic secure transmission (MST) antenna. The antenna 370 may perform short-range communication with an external device or transmit and receive power required for charging wirelessly. An antenna structure may be formed by a part or combination of the lateral bezel structure 310 and/or the first support member 311.

Figure 4:
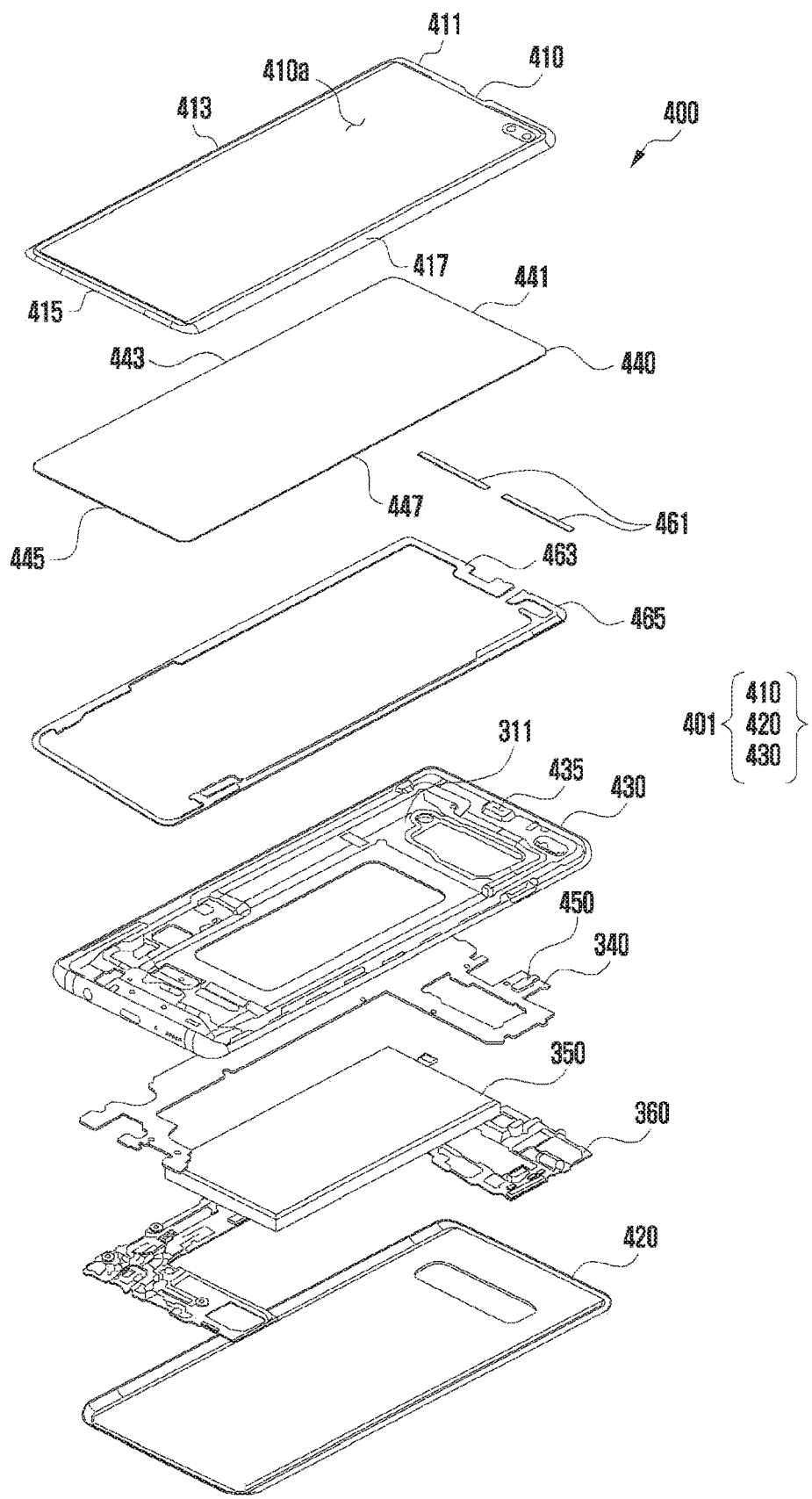
FIG. 4 is an exploded perspective view illustrating an electronic device according to an embodiment.

FIG. 4 is an exploded perspective view illustrating an electronic device 400 according to an embodiment.

The electronic device 400 may include a front plate 410, a rear plate 420, a lateral member 430, a display 440, a first adhesive member 461, and a second adhesive member 463, a third adhesive member 465, a receiver hole 435, an electronic component 450, a battery 350, and a circuit board 340.

The front plate 410 may be the same as or similar to the above-described front plate 102 shown in FIG. 1. The front plate 410 is disposed to face a first direction and may refer to a window of the electronic device 400. The first direction is faced by the window of the electronic device 400 and may indicate an upward direction in FIG. 4. The front plate 410 may have a shape of a rectangular plate composed of a first periphery 411 having a first length, a second periphery 413 having a second length greater than the first length and substantially perpendicular to the first periphery 411, a third periphery 415 having the first length and parallel to the first periphery 411, and a fourth periphery 417 having the second length and parallel to the second periphery 413. One periphery of the front plate 410 may indicate the first periphery 411.

The rear plate 420 may be the same as or similar to the above-described rear plate 111 shown in FIG. 2. The rear plate 420 is disposed to face a second direction and may refer to a rear cover or rear glass of the electronic device 400. The second direction is opposite to the first direction and may indicate a downward direction in FIG. 4.

The lateral member 430 may be the same as or similar to the above-described lateral member 118 shown in FIG. 1. The lateral member 430 is formed to surround a space between the front plate 410 and the rear plate 420 and may refer to a lateral bezel. The lateral member 430 may be formed integrally with or separately from the first support member 311 for supporting the display 440 mounted thereon.

The display 440 may be disposed on a rear surface of the front plate 410. The rear surface faces the second direction, and the rear surface of the front plate 410 may indicate a lower surface in FIG. 4. The display 440 may include a touch sensor detecting a touch input through the front plate 410, a display panel supplied with power and emitting light under the control of a display driver IC, a polarizing plate preventing light emitted by the display panel from being diffusely reflected or diffused in undesired directions, and a cover panel.

The display 440 may have a fifth periphery 441 having a third length and parallel to the first periphery 411 of the front plate 410, a sixth periphery 443 having a fourth length greater than the third length and parallel to the second periphery 413, a seventh periphery 445 having the third length and parallel to the fifth periphery 441, and an eighth periphery 447 having the fourth length and parallel to the sixth periphery 443. The third length may be equal to or less than the first length, and the fourth length may be equal to or less than the second length. One periphery of the display 440 may indicate the fifth periphery 441.

The electronic component 450 may include a light receiver and a light emitter. The electronic component 450 may be a time of flight (TOF) sensor or a proximity illuminance sensor. In an arrangement relationship with the display 440, the electronic component 450 may be composed of a first portion 451 (see FIG. 6B) disposed in an area not overlapped with the display 440, and a second portion 453 (see FIG. 6B) disposed on the rear surface of the display 440 so as to be overlapped with the display 440. The light emitter may be disposed in the first portion 451, and the light receiver may be disposed in the second portion 453. In order to ensure light receiving performance of the light receiver, some layers (e.g., the cover panel) of the display 440 corresponding to the position of the light receiver may be partially removed.

Figure 5:
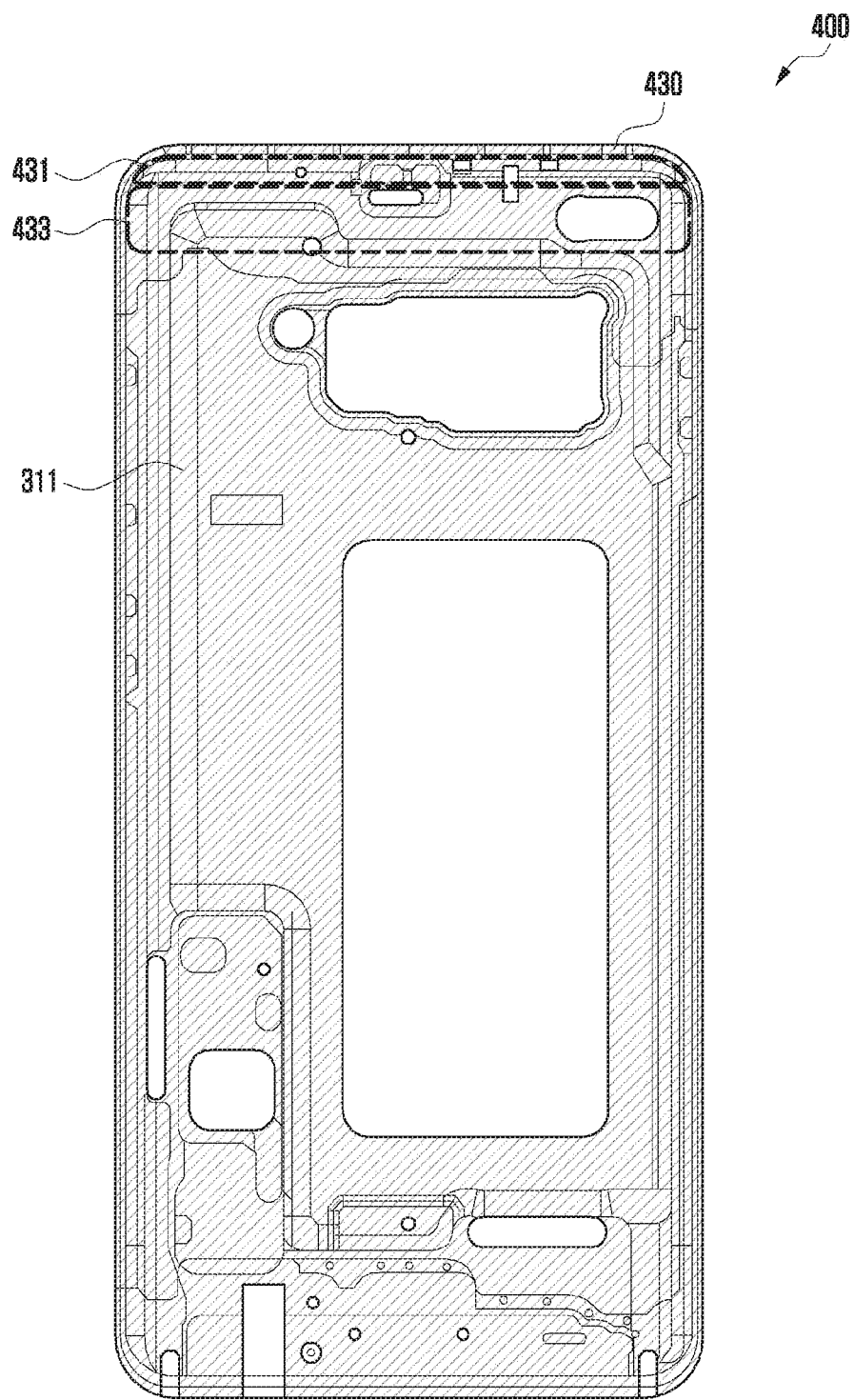
FIG. 5 is a view illustrating a lateral member according to an embodiment.

The electronic device 400 may include a first area 431 and a second area 433 (see FIG. 5). The first area 431 refers to at least a part of an area where the front plate 410 is mounted on the lateral member 430. The second area 433 refers to at least a part of an area where the display 440 is mounted on the first support member 311 formed integrally with or separately from the lateral member 430. That is, when the front plate 410 is viewed from above, i.e., when viewing a front surface 410a of the front plate 410, the first area 431 may be between the first periphery 411 of the front plate 410 and the fifth periphery 441 of the display 440, and the second area 433 may adjoin the first area 431 and overlap with a part of the display 440.

The first area 431 corresponds to a size difference between the front plate 410 and the display 440 and may be an inactive region or BM region where a screen is not displayed. As the overall size of the electronic device 400 is decreased but the size of the display 440 is maximized, the size of the first area 431 tends to be minimized. When the first area 431 is minimized, a space for disposing the electronic component 450 in the first area 431 may be reduced. Thus, the electronic component 450 may be disposed over both the first area 431 and the second area 433. That is, the first portion 451 of the electronic component 450 may be disposed in the first area 431, and the second portion 453 may be disposed in the second area 433.

As will be further described with reference to FIG. 6B, the first adhesive member 461 is disposed in the first area 431 to surround a part of the first portion 451 of the electronic component 450 and may combine the front plate 410 and the lateral member 430.

As will be further described with reference to FIG. 6C, the second adhesive member 463 is disposed in the second area 433, is spaced apart from the first adhesive member 461, is disposed on one side of the electronic component 450, and may be extended along the fifth periphery 441.

As will be further described with reference to FIG. 6B, the third adhesive member 465 is disposed in the second area 433, is spaced apart from the first adhesive member 461, is disposed on the other side of the electronic component 450, and may be extended along the fifth periphery 441.

A receiver is disposed in the housing 401 and is a component for transmitting another party's voice to a user through the receiver hole 435 during a telephone call.

The receiver hole 435 is disposed adjacent to the lateral member 430 near the first periphery 411 of the front plate 410 when the front plate 410 is viewed from above. The first periphery 411 of the front plate 410 may be formed to have a cut portion (also referred to as a notch type) recessed toward the center of the front plate such that at least a portion of the receiver hole 435 is exposed. Alternatively, the first periphery 411 of the front plate 410 may be formed to have an opening (also referred to as an island type) such that at least a portion of the receiver hole 435 is exposed.

The battery 350 and the printed circuit board 340 may be the same as or similar to those of FIG. 3.

The second support member 360, for example, may be coupled to the first support member 311, and may be disposed between the printed circuit board 340 and the rear plate 111. The second support member 360 may be coupled to the first support member 311 with the printed circuit board 340 via a joint means such as a bolt. The second support member 360 may cover the printed circuit board 340 for protection. The second support member 360 may be formed of a metallic material and/or a non-metallic (e.g., polymer) material.

FIG. 5 is a view illustrating a lateral member 430 according to an embodiment.

The lateral member 430 of the electronic device 400 may include the first area 431 and the second area 433. The first area 431 may be a portion of the lateral member 430 where the front plate 410 is directly mounted. The second area 433 may be a portion of the lateral member 430 where the display 440 is mounted. Because of a difference in size between the front plate 410 and the display 440 (see FIG. 4), the first area 431 may be formed as a high-level portion of the lateral member 430, and the second area 433 may be formed as a low-level portion of the lateral member 430. That is, the second area 433 may be recessed into the electronic device 400 from the plane constituting the first area 431, and a stepped portion may thus be formed between the first and second areas 431 and 433. This will be further described in reference to FIG. 8. The height of the stepped portion may correspond to the thickness of the display 440.

Figure 6A:
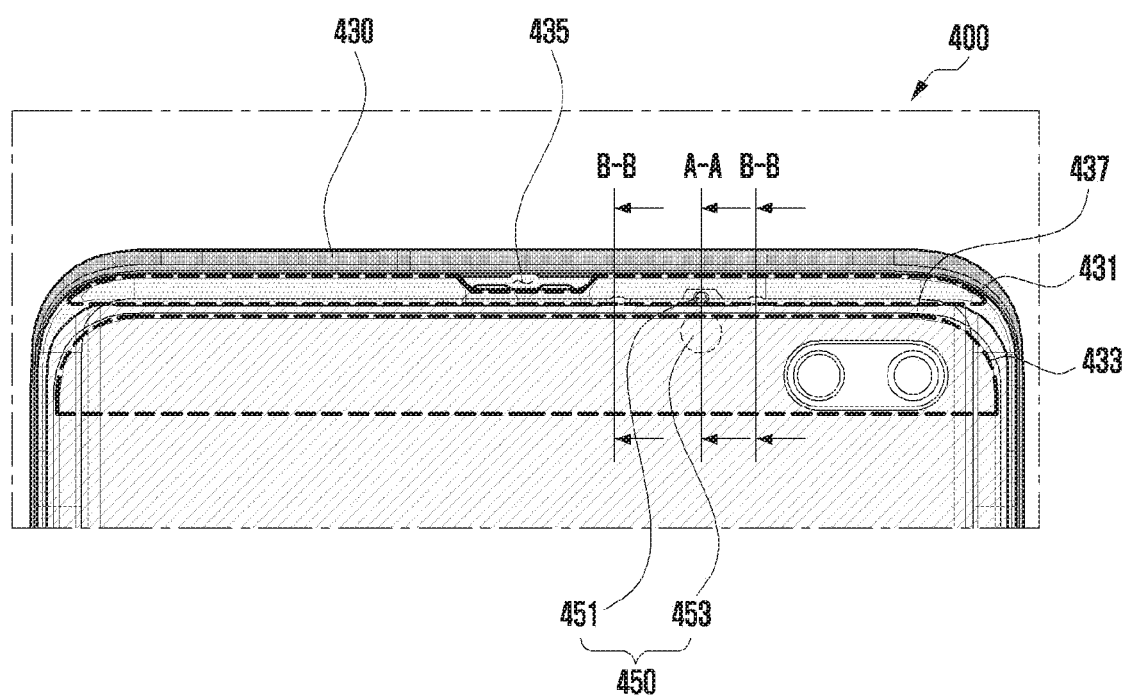
FIGS. 6A, 6B and 6C are enlarged views illustrating an electronic component according to an embodiment.
Figure 6B:
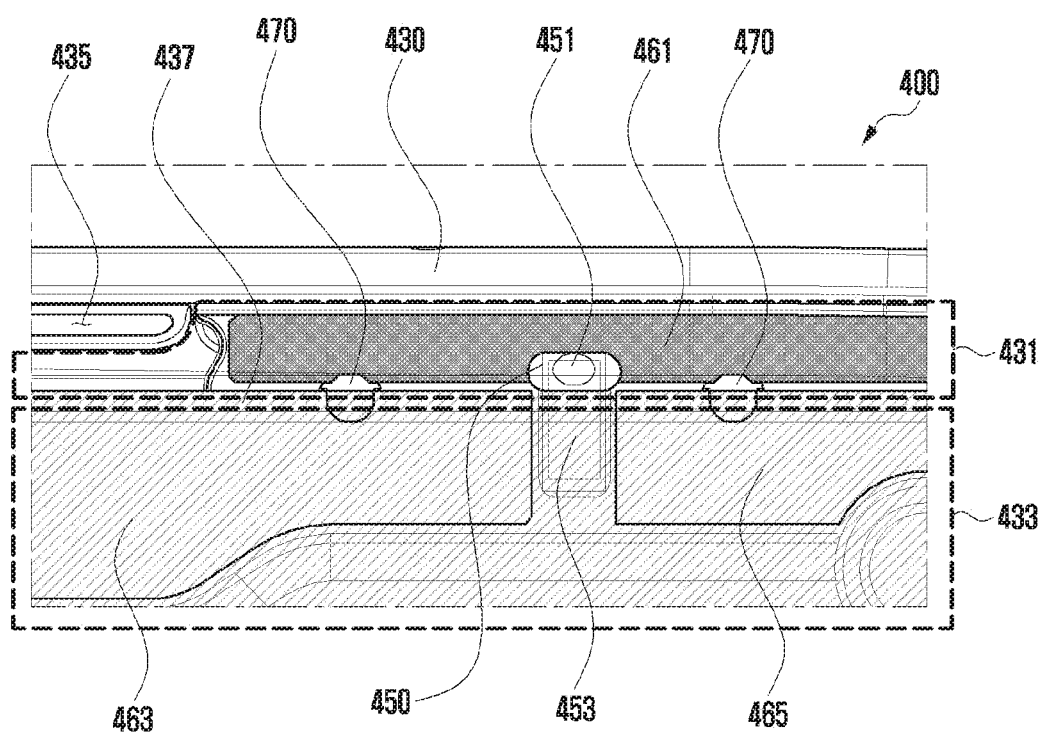
Figure 6C:
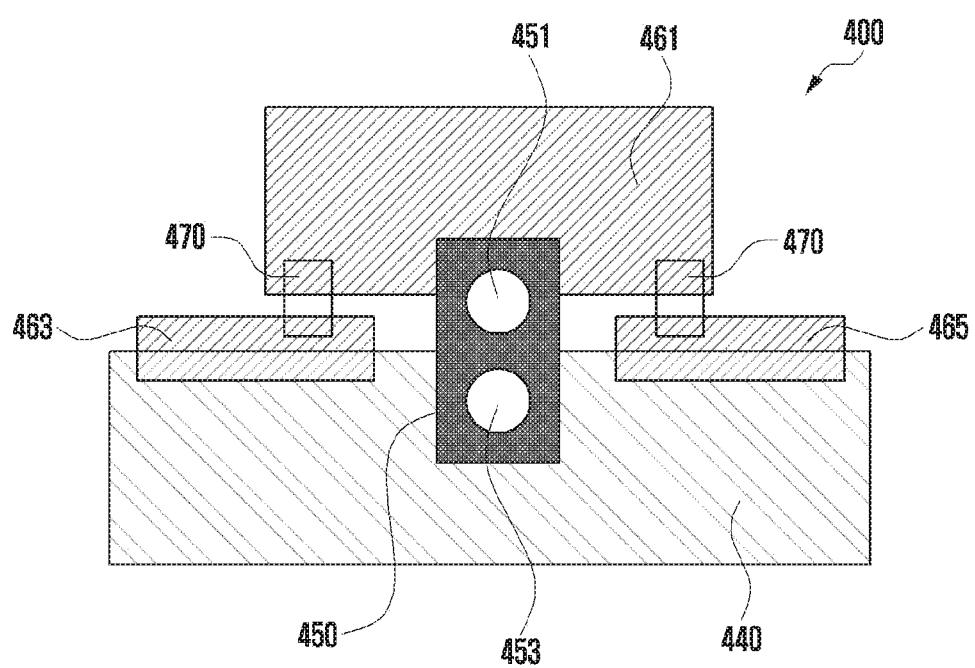

FIGS. 6A, 6B and 6C are enlarged views illustrating the electronic component 450 according to an embodiment.

FIG. 6A is an enlarged view illustrating an upper portion of the electronic device 400 according to an embodiment of the disclosure, and FIG. 6B is a further enlarged view illustrating the electronic component 450. In addition, Referring to FIGS. 6A and 6B, the receiver hole 435 may be formed in the first area 431 and disposed adjacent to the lateral member 430. The first periphery 411 of the front plate 410 (see FIG. 4) may be formed to have a cut portion (also referred to as a notch type) corresponding to the position of the receiver hole 435 such that at least a portion of the receiver hole 435 is exposed. Alternatively, the first periphery 411 of the front plate 410 may be formed to have an opening (also referred to as an island type) corresponding to the position of the receiver hole 435 such that at least a portion of the receiver hole 435 is exposed.

The first adhesive member 461 is formed along the first periphery 411 of the front plate 410 in the first area 431 and may block an inflow of water through a boundary between the lateral member 430 and the first periphery 411 of the front plate 410. The first adhesive member 461 combines the front plate 410 with the lateral member 430 through surface contact and blocks the inflow of water. The first adhesive member 461 may be divided into parts, based on the receiver hole 435, which may be formed separately or integrally.

The second adhesive member 463 and the third adhesive member 465 may be formed along the fifth periphery 441 to the eighth periphery 447 of the display 440 (see FIG. 4) in the second area 433. The second adhesive member 463 and the third adhesive member 465 may be integrally formed along the fifth periphery 441 to the eighth periphery 447 or may be separately formed and connected to each other.

As the electronic component 450 is disposed over the first and second areas 431 and 433, an adhesive member disposed in the fifth periphery 441 may be divided. For example, the second adhesive member 463 may be located on one side (e.g., left in FIG. 6B) of the electronic component 450, and the third adhesive member 465 may be located on the other side (e.g., right in FIG. 6B) of the electronic component 450. The second and third adhesive members 463 and 465 combine the display 440 with the lateral member 430 and also block an inflow of water through the fifth periphery 441. However, because the second adhesive member 463 and the third adhesive member 465 are separated from each other around the electronic component 450, the continuity of a waterproof loop 480, described in FIG. 7, may be broken. In order to prevent this problem, the second and third adhesive members 463 and 465 may be disposed in the second area 433 to be adjacent and connected to the first adhesive member 461 in the first area 431. However, due to a stepped portion 437 of the lateral member 430 formed between the first area 431 and the second area 433, a complete connection between such adjacent adhesive members may be difficult.

FIG. 6C is a schematic view illustrating the electronic component 450, the first adhesive member 461, the second adhesive member 463, the third adhesive member 465, and a waterproof seal member 470.

Referring to FIGS. 6B and 6C, the waterproof seal member 470 may be provided in the stepped portion 437 formed between the first area 431 and the second area 433 so as to connect the first and second adhesive members 461 and 463 and also connect the first and third adhesive members 461 and 465. For example, the second area 433 may be recessed into the electronic device 400 from the plane constituting the first area 431, and the stepped portion 437 may thus be formed between the first and second areas 431 and 433. As a result, it is possible to complete the waterproof loop 480 of the electronic device 400. The waterproof seal member 470 having a liquid form may be injected into a hole of the stepped portion 437 and cured.

Although FIGS. 6B and 6C show the waterproof seal member 470 closer to the electronic component 450 than to the fourth periphery 417, the waterproof seal member 470 may be disposed closer to the fourth periphery 417.

Figure 7:
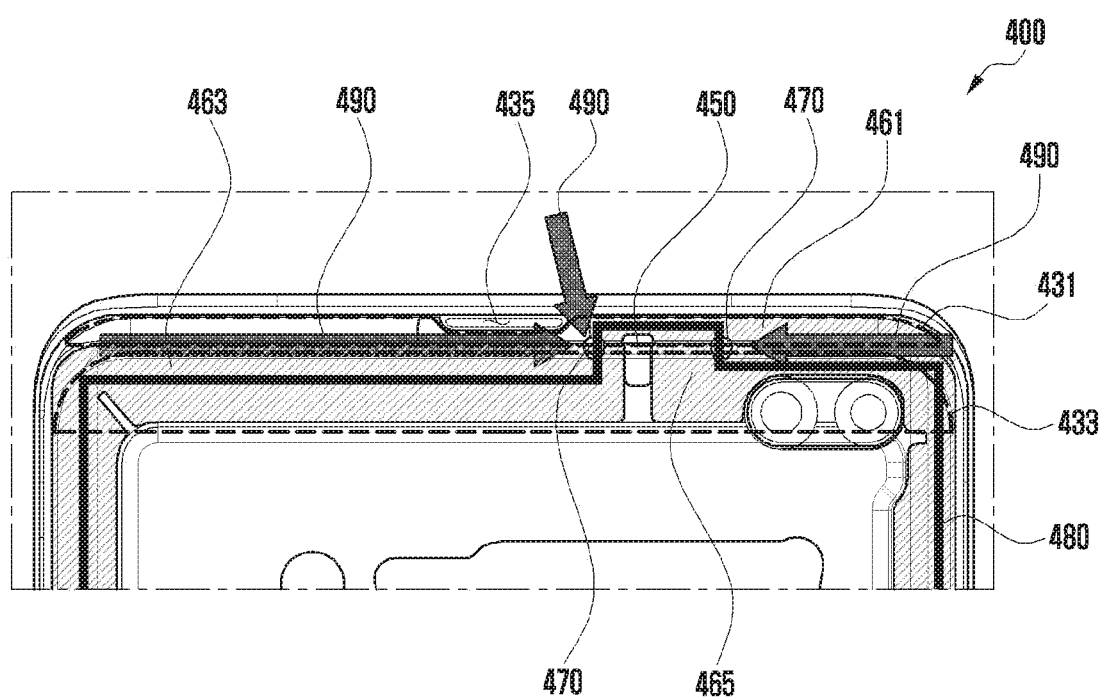
FIG. 7 is a view illustrating a waterproof loop of an electronic device according to an embodiment.

FIG. 7 is a view illustrating a waterproof loop 480 and a water inflow route 490 of an electronic device according to an embodiment.

In order to waterproof the electronic device 400, it is important to seal boundary portions where various components of the electronic device 400 are combined. For example, it is important to seal a portion where the front plate 410 and the lateral member 430 are combined, and seal a portion where the rear plate 420 and the lateral member 430 are combined. To do so, it is required to complete the waterproof loop 480 forming a closed curve along the boundary portions. The waterproof loop 480 may resemble one ring or any other shape composed of various lines. The waterproof loop 480 may block an inflow of water (or moisture) into the electronic device 400 through various routes, such as route 490.

The waterproof loop 480 of the electronic device 400 may be formed of the first adhesive member 461, the second adhesive member 463, the third adhesive member 465, and the waterproof seal member 470.

In the electronic device 400, the waterproof seal member 470 having fluidity and provided in the stepped portion 437 between the first and second areas 431 and 433 can secure the continuity of the waterproof loop 480 by connecting the first adhesive member 461 to each of the second and third adhesive members 463 and 465.

Figure 8:
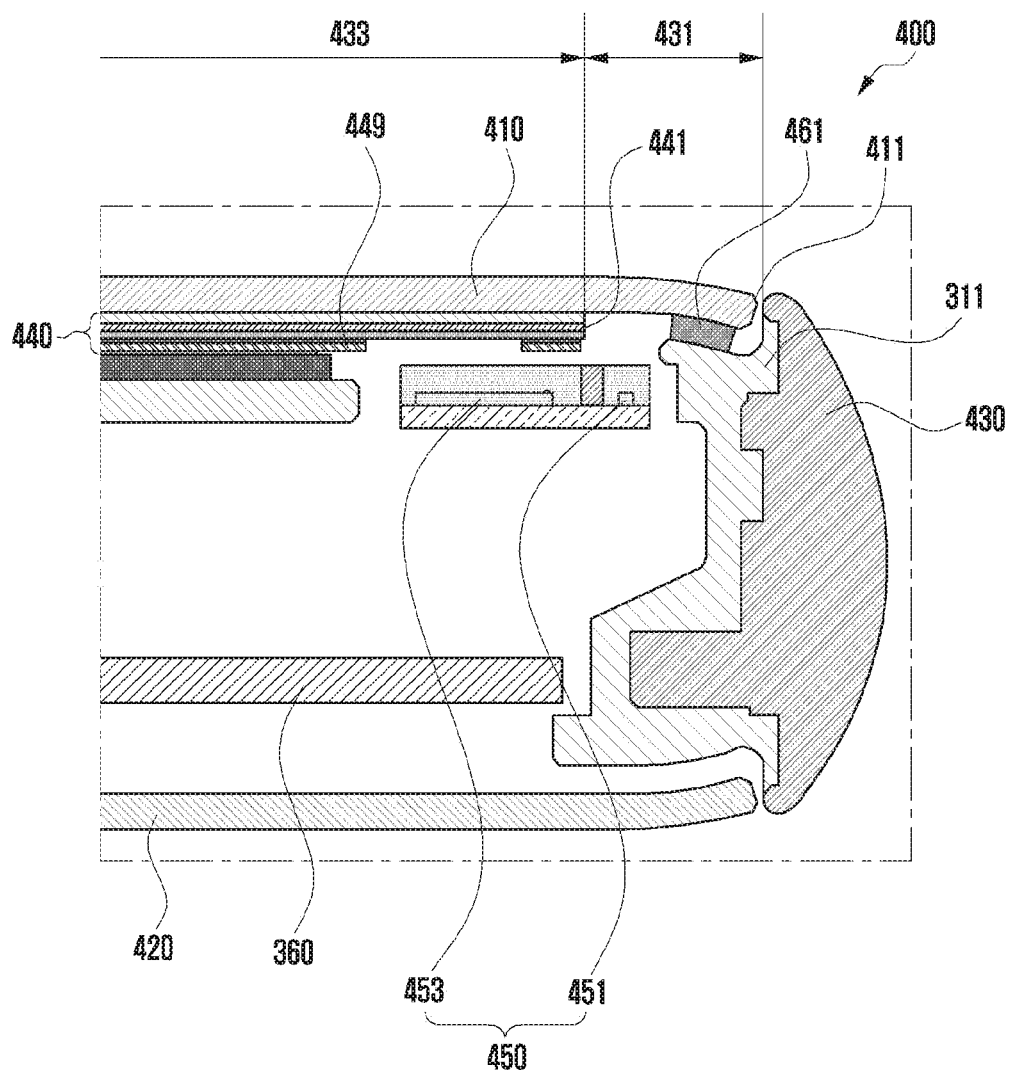
FIG. 8 is a cross-sectional view taken along the line A-A of FIG. 6A.
Figure 9:
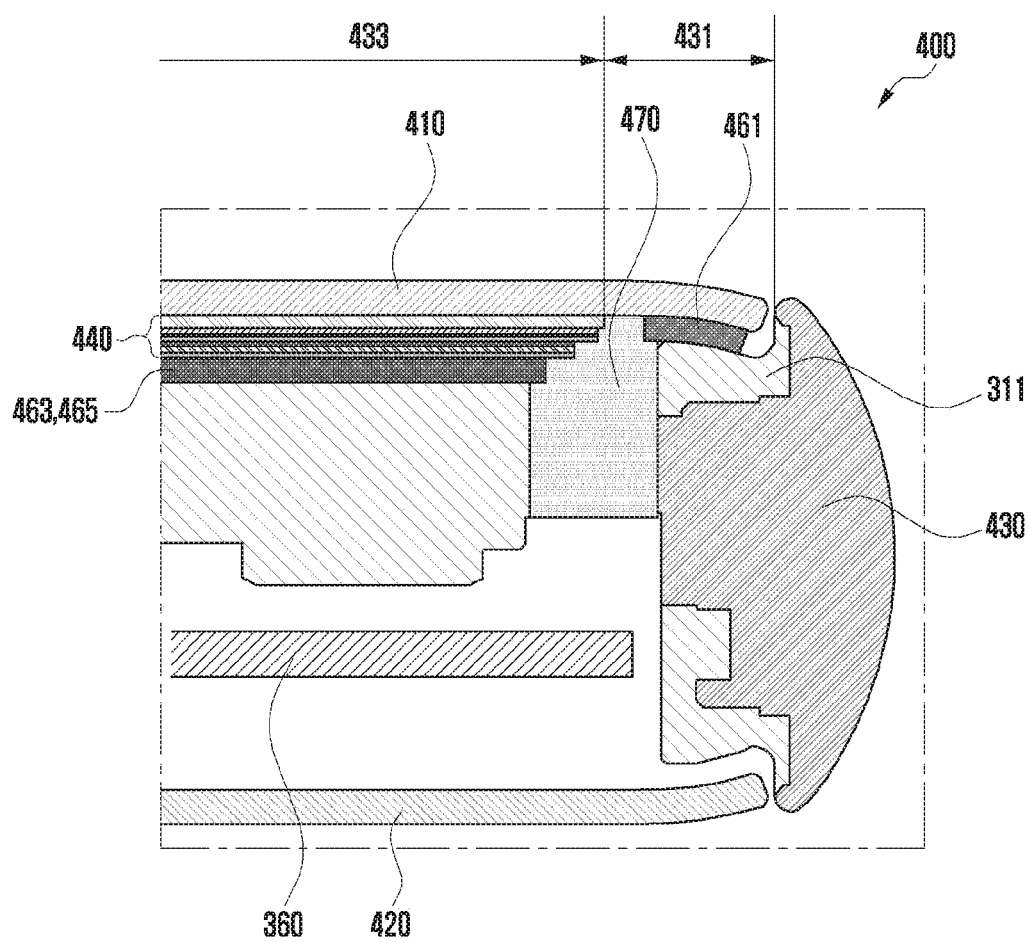
FIG. 9 is a cross-sectional view taken along the line B-B of FIG. 6A.

FIG. 8 is a cross-sectional view taken along the line A-A of FIG. 6A, and FIG. 9 is a cross-sectional view taken along the line B-B of FIG. 6A. That is, FIG. 8 is a cross-sectional view illustrating a portion where the electronic component 450 is disposed, and FIG. 9 is a cross-sectional view illustrating a portion where the waterproof seal member 470 is disposed.

The first area 431 may be formed to be recessed more than the outermost portion of the lateral member 430 that the first periphery 411 of the front plate 410 adjoins. That is, compared to the top of the outermost portion of the lateral member 430, the first area 431 may be recessed by a depth corresponding to the sum of a thickness of the front plate 410 and a thickness of the first adhesive member 461. Thus, even after the front plate 410 is combined with the first area 431 through the first adhesive member 461, the appearance of the electronic device 400 may be smoothly formed.

The second area 433 may be formed to be further recessed than the first area 431. That is, compared to the top of the first area 431, the second area 433 may be further recessed as much as the sum of a thicknesses of the display 440 and a thickness of the second adhesive member 463.

Referring to FIG. 8, in the electronic component 450, the first portion 451 may be disposed to be overlapped with the front plate 410 without overlapping the display 440, and the second portion 453 may be disposed to be overlapped with both the front plate 410 and the display 440. When the electronic component 450 is a proximity illuminance sensor or a TOF sensor, a light emitter may be disposed in the first portion 451, and a light receiver may be disposed in the second portion 453. In order to ensure light receiving performance of the light receiver, a cover panel 449 of the display 440 corresponding to the position of the light receiver may be partially removed.

As described above, the electronic device 400 may include the first area 431 and the second area 433. The first area 431 refers to at least a part of an area where the front plate 410 is mounted on the lateral member 430. The second area 433 refers to at least a part of an area where the display 440 is mounted on the lateral member 430. That is, when the front plate 410 is viewed from above, the first area 431 may be an area between the first periphery 411 of the front plate 410 and the fifth periphery 441 of the display 440.

Referring to FIGS. 6A, 8, and 9, an upper side of the electronic component 450 in FIG. 6A may be protected from an inflow of water by the first adhesive member 461 positioned on the right side of the electronic device 400 in FIG. 8. In addition, left and right sides of the electronic component 45 in FIG. 6A may be protected from an inflow of water by the waterproof seal member 470 of FIG. 9 that connects the first adhesive member 461 to the second or third adhesive member 463 or 465.

Figure 10A:
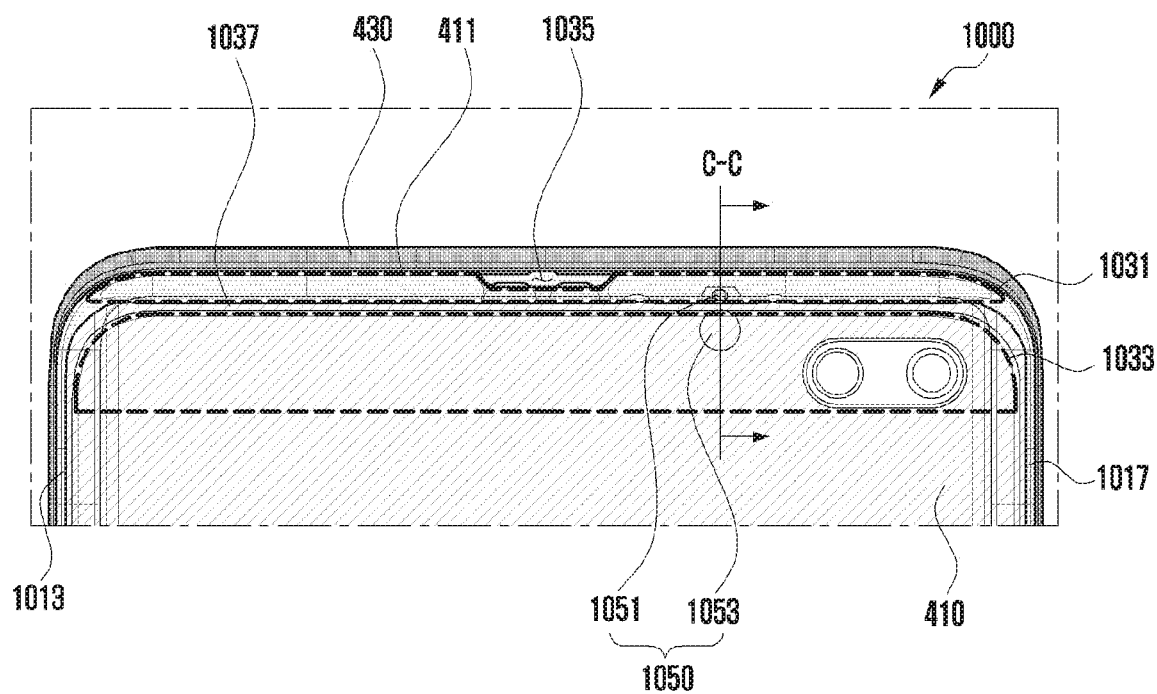
FIGS. 10A and 10B are enlarged views illustrating an electronic component according to an embodiment.
Figure 10B:
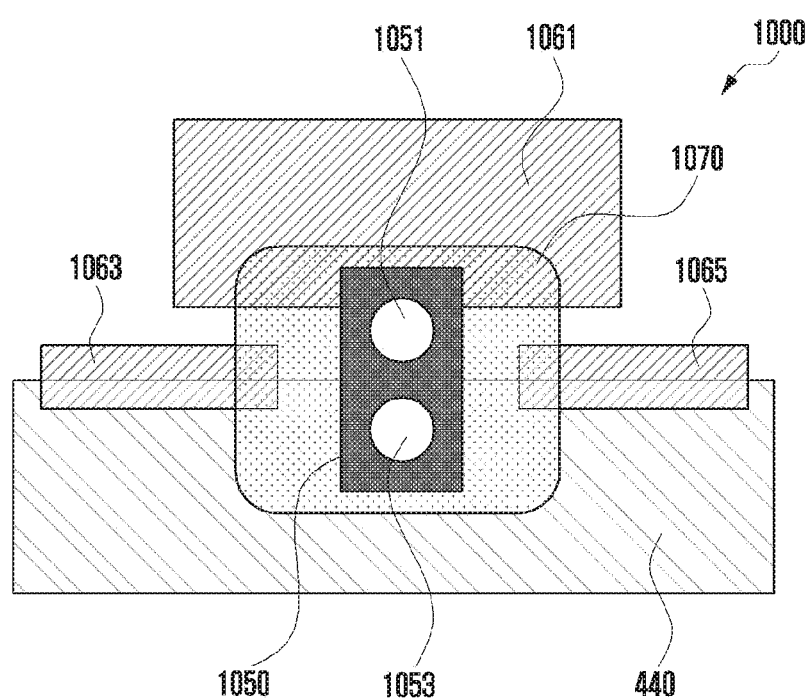

FIGS. 10A and 10B are enlarged views illustrating an electronic component 1050 according to an embodiment.

FIG. 10A is an enlarged view illustrating an upper portion of an electronic device 1000 according to an embodiment, and FIG. 10B is a schematic view illustrating the electronic component 1050, a first adhesive member 1061, a second adhesive member 1063, a third adhesive member 1065, and a waterproof seal member 1070, according to an embodiment.

Referring to FIG. 10A, a receiver hole 1035 may be formed in a first area 1031 and disposed adjacent to the lateral member 430. The first periphery 411 of the front plate 410 may be formed to have a cut portion (also referred to as a notch type) corresponding to the position of the receiver hole 1035 so as to avoid interference with the receiver holes 1035.

Referring to FIG. 10B, the waterproof seal member 1070 may be provided to fill a space between the electronic component 1050 and the front plate 410. For example, the waterproof seal member 1070 may be applied in a liquid form between the electronic component 1050 and the front plate 410 so as to connect the first, second, and third adhesive members 1061, 1063, and 1065, thus completing a waterproof loop 1080 (see FIG. 12) of the electronic device 1000.

Figure 11:
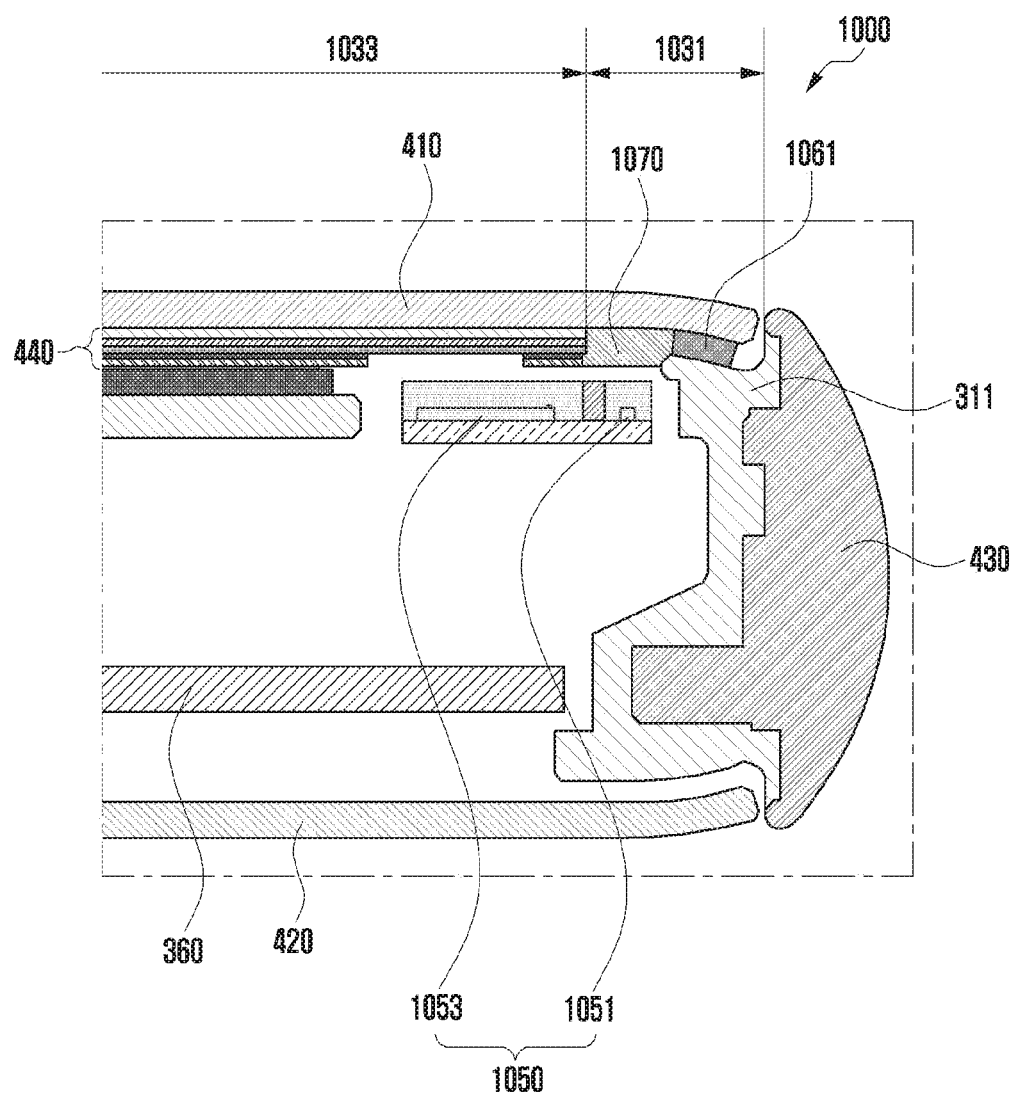
FIG. 11 is a cross-sectional view taken along the line C-C of FIG. 10A.

FIG. 11 is a cross-sectional view taken along the line C-C of FIG. 10A.

The waterproof seal member 1070 may be formed to be connected to the first adhesive member 1061 while filling, at least in part, a stepped portion formed by the display 440 and the front plate 410 in a space between the electronic component 1050 and the front plate 410.

Figure 12:
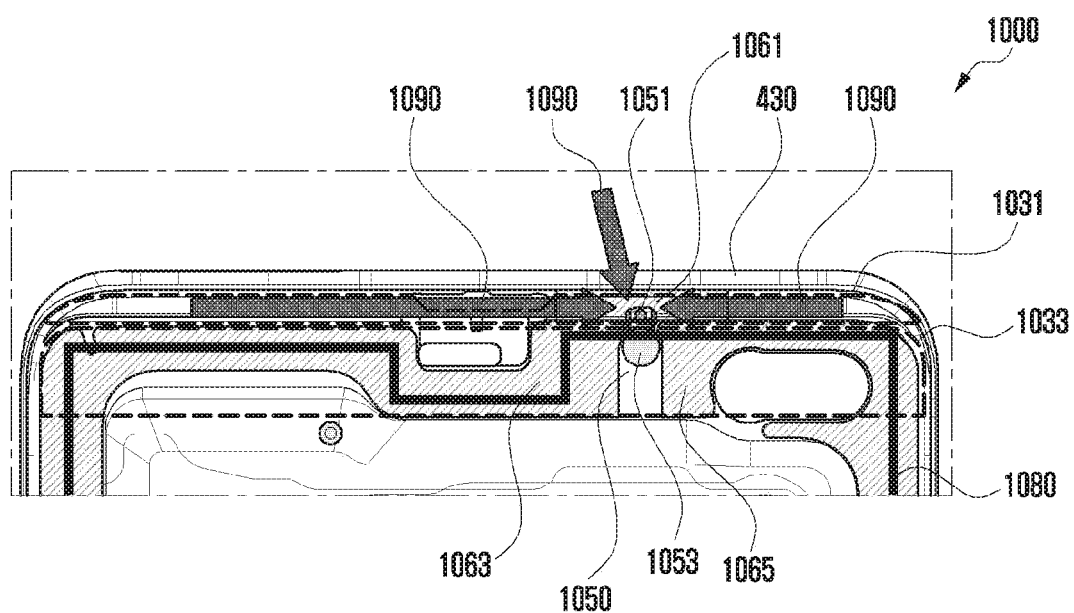
FIG. 12 is a view illustrating a waterproof loop of an electronic device according to an embodiment.

FIG. 12 is a view illustrating a waterproof loop 1080 and a water inflow route 1090 of an electronic device according to an embodiment.

As illustrated in FIG. 12, the waterproof loop 1080 may block an inflow of water (or moisture) into the electronic device 1000 through various routes 1090.

The waterproof loop 1080 of the electronic device 1000 may include the first adhesive member 1061, the second adhesive member 1063, the third adhesive member 1065, and the waterproof seal member 1070. In particular, the waterproof seal member 1070 may fill a space between the electronic component 1050 and the front plate 410. As a result, the waterproof loop 1080 may be completed by connecting the first adhesive member 1061, the second adhesive member 1063, and the third adhesive member 1065 around the electronic component 1050 at a time. Compared to the embodiment of FIG. 6A, the embodiment of FIG. 12 renders unnecessary the creation of a hole for injection of the waterproof seal member 1070.

According to an embodiment, an electronic device may include a housing, a display, an electronic component, a first adhesive member, a second adhesive member, a third adhesive member, and at least one waterproof seal member. The housing may include a front plate, a rear plate spaced apart from and disposed to be parallel with the front plate, and a lateral member surrounding a space between the front plate and the second plate. The display may be disposed in the space of the housing, seen through at least a part of the front plate, and formed to have less area than the front plate.

The electronic component may be disposed in the housing and may include, when the front plate is viewed from above, a first portion overlapped with the front plate, and a second portion overlapped with both the display and the front plate. The first adhesive member may be disposed between the front plate and the lateral member and may surround a part of the first portion. The second adhesive member may be disposed between the display and the lateral member, spaced apart from the first adhesive member, and extended in one direction along one periphery of the display around the electronic component. The third adhesive member may be disposed between the display and the lateral member, spaced apart from the first adhesive member, and extended in another direction along the one periphery of the display around the electronic component. The at least one waterproof seal member may fill, at least in part, a space between the first and second adhesive members and a space between the first and third adhesive members.

The first portion of the electronic component may be disposed in a first area between one periphery of the front plate and the one periphery of the display corresponding to the one periphery of the front plate when the front plate is viewed from above, and the second portion of the electronic component may be disposed in a second area adjoining the first area and overlapping with a part of the display when the front plate is viewed from above.

The electronic component may include an image sensor or an optical sensor.

The electronic component may include a light emitter and a light receiver. The light emitter may be disposed in the first portion, and the light receiver may be disposed in the second portion.

The second area may be recessed than the first area, thereby forming a stepped portion between the first and second areas.

The first portion disposed in the first area may be formed on substantially a same level as the second area.

The electronic device may include a receiver hole formed in the first area and disposed adjacent to the lateral member.

When the front plate is viewed from above, the one periphery of the front plate may be formed to have a cut portion recessed toward a center of the front plate such that at least a portion of the receiver hole is exposed.

The at least one waterproof seal member may be formed between the electronic component and the receiver hole.

The at least one waterproof seal member may be disposed closer to another periphery of the front plate between the electronic component 450 and the another periphery of the front plate.

The at least one waterproof seal member may be disposed closer to the electronic component between the electronic component and another periphery of the front plate.

According to another embodiment, an electronic device may include a housing, a display, an electronic component, a first adhesive member, a second adhesive member, a third adhesive member, and at least one waterproof seal member. The housing may include a front plate, a rear plate spaced apart from and disposed to be parallel with the front plate, and a lateral member surrounding a space between the front plate and the second plate. The display may be disposed in the space of the housing, seen through at least a part of the front plate, and formed to have less area than the front plate. The electronic component may be disposed in the housing and may include, when the front plate is viewed from above, a first portion partially overlapped with the front plate, and a second portion partially overlapped with both the display and the front plate. The first adhesive member may be disposed between the front plate and the lateral member and may surround a part of the first portion. The second adhesive member may be disposed between the display and the lateral member, spaced apart from the first adhesive member, and extended in one direction along one periphery of the display around the electronic component. The third adhesive member may be disposed between the display and the lateral member, spaced apart from the first adhesive member, and extended in another direction along the one periphery of the display around the electronic component. The at least one waterproof seal member may fill, at least in part, a space between the front plate and the electronic component.

The first portion of the electronic component may be disposed in a first area between one periphery of the front plate and the one periphery of the display corresponding to the one periphery of the front plate when the front plate is viewed from above, and the second portion of the electronic component may be disposed in a second area adjoining the first area and overlapping with a part of the display when the front plate is viewed from above.

The electronic component may include an image sensor or an optical sensor.

The electronic component may include a light emitter and a light receiver. The light emitter may be disposed in the first portion, and the light receiver may be disposed in the second portion.

The second area may be recessed than the first area, thereby forming a stepped portion between the first and second areas.

The first portion disposed in the first area may be formed on substantially a same level as the second area.

The electronic device may include a receiver hole formed in the first area and disposed adjacent to the lateral member.

When the front plate is viewed from above, the one periphery of the front plate may be formed to have a cut portion recessed toward a center of the front plate such that at least a portion of the receiver hole is exposed.

According to another embodiment, an electronic device may include a housing, a display, an electronic component, a first adhesive member, a second adhesive member, a third adhesive member, and at least one waterproof seal member. The housing may include a front plate facing a first direction, a rear plate facing a second direction opposite to the first direction, and a lateral member surrounding a space between the front plate and the second plate. The front plate may have a first periphery having a first length, a second periphery having a second length greater than the first length and substantially perpendicular to the first periphery, a third periphery having the first length and parallel to the first periphery, and a fourth periphery having the second length and parallel to the second periphery. The display may be disposed in the space of the housing, be seen through at least a part of the front plate, and have a fifth periphery having a third length and parallel to the first periphery, a sixth periphery having a fourth length greater than the third length and parallel to the second periphery, a seventh periphery having the third length and parallel to the fifth periphery, and an eighth periphery having the fourth length and parallel to the sixth periphery. The electronic component may be disposed in the housing and may include, when the front plate is viewed from above, a first portion disposed in a first area between the first periphery of the front plate and the fifth periphery of the display, and a second portion disposed in a second area adjoining the first area and overlapping with a part of the display. The first adhesive member may be disposed between the front plate and the lateral member and may surround a part of the first portion when the front plate is viewed from above. The second adhesive member may be disposed between the display and the lateral member, spaced apart from the first adhesive member, and extended along one part of the fifth periphery when the front plate is viewed from above. The third adhesive member may be disposed between the display and the lateral member, spaced apart from the first adhesive member, extended along another part of the fifth periphery when the front plate is viewed from above, and positioned such that the electronic component is disposed between the second and third adhesive members. The at least one waterproof seal member may fill, at least in part, a space between the first and second adhesive members and a space between the first and third adhesive members.

While the disclosure has been particularly shown and described with reference to embodiments thereof, it will be understood by those skilled in the art that various changes in form and details may be made therein without departing from the scope of the subject matter as defined by the appended claims and their equivalents.

What is claimed is:

1. An electronic device comprising:
   a housing including a front plate, a rear plate spaced apart from and disposed to be parallel with the front plate, and a lateral member surrounding a space between the front plate and the second plate;
   a display disposed in the space of the housing, being viewable through at least a part of the front plate, and formed to have less area than the front plate;
   an electronic component disposed in the housing and including:
   when the front plate is viewed from above, a first portion overlapping the front plate and not overlapping the display, and a second portion overlapping both the display and the front plate;
   a first adhesive member disposed between the front plate and the lateral member and surrounding a part of the first portion;
   a second adhesive member disposed between the display and the lateral member, spaced apart from the first adhesive member, and extended in a first direction along one periphery of the display around the electronic component;
   a third adhesive member disposed between the display and the lateral member, spaced apart from the first adhesive member, and extended in a second direction along the one periphery of the display around the electronic component; and at least one waterproof seal member filling, at least in part, a space between the first and second adhesive members and a space between the first and third adhesive members, wherein the electronic device includes a receiver hole disposed adjacent to the lateral member, wherein at least one waterproof seal member is formed between the electronic component and the receiver hole, wherein, when the front plate is viewed from above the display, one periphery of the front plate is formed to have a cut portion recessed toward a center of the front plate such that at least a portion of the receiver hole is exposed to outside of the electronic device, wherein the first portion of the electronic component is disposed in a first area and the second portion of the electronic component is disposed in a second area adjoining the first area, and wherein the second area is recessed into the electronic device more than the first area, thereby forming a stepped portion between the first and second areas.

2. The electronic device of claim 1,
wherein the first area is between the one periphery of the front plate and the one periphery of the display corresponding to the one periphery of the front plate when the front plate is viewed from above the display, and
wherein the second area overlaps a part of the display when the front plate is viewed from above the display.

3. The electronic device of claim 2,
wherein the electronic component includes an image sensor or an optical sensor.

4. The electronic device of claim 2,
wherein the electronic component includes a light emitter and a light receiver, and
wherein the light emitter is disposed in the first portion, and the light receiver is disposed in the second portion.

5. The electronic device of claim 4,
wherein the first portion disposed in the first area is formed on substantially a same level as the second area.

6. The electronic device of claim 4,
wherein the receiver hole disposed adjacent to the lateral member is formed in the first area.

7. The electronic device of claim 1,
wherein the at least one waterproof seal member is disposed closer to another periphery of the front plate between the electronic component and the another periphery of the front plate.

8. The electronic device of claim 1,
wherein the at least one waterproof seal member is disposed closer to the electronic component between the electronic component and the another periphery of the front plate.

9. An electronic device comprising:
a housing including a front plate, a rear plate spaced apart from and disposed to be parallel with the front plate, and a lateral member surrounding a space between the front plate and the second plate;
a display disposed in the space of the housing, being viewable through at least a part of the front plate, and formed of less area than the front plate;
an electronic component disposed in the housing and including:
when the front plate is viewed from above the display, a first portion partially overlapping the front plate and not overlapping the display, and a second portion partially overlapping both the display and the front plate;
a first adhesive member disposed between the front plate and the lateral member and surrounding a part of the first portion;
a second adhesive member disposed between the display and the lateral member, spaced apart from the first adhesive member, and extended in a first direction along one periphery of the display around the electronic component;
a third adhesive member disposed between the display and the lateral member, spaced apart from the first adhesive member, and extended in a second direction along the one periphery of the display around the electronic component; and
at least one waterproof seal member filling, at least in part, a space between the front plate and the electronic component,
wherein the electronic device includes a receiver hole disposed adjacent to the lateral member,
wherein at least one waterproof seal member is formed between the electronic component and the receiver hole, and
wherein, when the front plate is viewed from above the display, one periphery of the front plate is formed to have a cut portion recessed toward a center of the front plate such that at least a portion of the receiver hole is exposed to outside of the electronic device,
wherein the first portion of the electronic component is disposed in a first area and the second portion of the electronic component is disposed in a second area adjoining the first area, and
wherein the second area is recessed into the electronic device more than the first area, thereby forming a stepped portion between the first and second areas.

10. The electronic device of claim 9,
wherein the first area is between the one periphery of the front plate and the one periphery of the display corresponding to the one periphery of the front plate when the front plate is viewed from above the display, and
wherein the second overlaps a part of the display when the front plate is viewed from above the display.

11. The electronic device of claim 10,
wherein the electronic component includes an image sensor or an optical sensor.

12. The electronic device of claim 11,
wherein the electronic component includes a light emitter and a light receiver, and
wherein the light emitter is disposed in the first portion, and the light receiver is disposed in the second portion.

13. The electronic device of claim 12,
wherein the first portion disposed in the first area is formed on substantially a same level as the second area.

14. The electronic device of claim 12,
wherein the receiver hole disposed adjacent to the lateral member is formed in the first area.

15. An electronic device comprising:
a housing including a front plate facing a first direction, a rear plate facing a second direction opposite to the first direction, and a lateral member surrounding a space between the front plate and the second plate, the front plate having a first periphery having a first length, a second periphery having a second length greater than the first length and substantially perpendicular to the first periphery, a third periphery having the first length and parallel to the first periphery, and a fourth periphery having the second length and parallel to the second periphery;

a display disposed in the space of the housing and being viewable through at least a part of the front plate, the display having a fifth periphery having a third length and parallel to the first periphery, a sixth periphery having a fourth length greater than the third length and parallel to the second periphery, a seventh periphery having the third length and parallel to the fifth periphery, and an eighth periphery having the fourth length and parallel to the sixth periphery;

an electronic component disposed in the housing and including:

when the front plate is viewed from above the display, a first portion disposed in a first area between the first periphery of the front plate and the fifth periphery of the display and not overlapping the display, and a second portion disposed in a second area adjoining the first area and overlapping a part of the display;

a first adhesive member disposed between the front plate and the lateral member and surrounding a part of the first portion when the front plate is viewed from above the display;

a second adhesive member disposed between the display and the lateral member, spaced apart from the first adhesive member, and extended along one part of the fifth periphery when the front plate is viewed from above the display;

a third adhesive member disposed between the display and the lateral member, spaced apart from the first adhesive member, extended along another part of the fifth periphery when the front plate is viewed from above the display, and positioned such that the electronic component is disposed between the second and third adhesive members; and at least one first waterproof seal member filling, at least in part, a space between the first and second adhesive members and a space between the first and third adhesive members, wherein the electronic device includes a receiver hole disposed adjacent to the lateral member, wherein at least one second waterproof seal member is formed between the electronic component and the receiver hole, wherein, when the front plate is viewed from above the display, one periphery of the front plate is formed to have a cut portion recessed toward a center of the front plate such that at least a portion of the receiver hole is exposed to outside of the electronic device, wherein the first portion of the electronic component is disposed in a first area and the second portion of the electronic component is disposed in a second area adjoining the first area, and wherein the second area is recessed into the electronic device more than the first area, thereby forming a stepped portion between the first and second areas.

* * * * *